US010536110B2

(12) United States Patent
Grushkowitz et al.

(10) Patent No.: US 10,536,110 B2
(45) Date of Patent: *Jan. 14, 2020

(54) FRAME-MOUNTED WIRE MANAGEMENT DEVICE

(71) Applicant: SunPower Corporation, San Jose, CA (US)

(72) Inventors: Tyler Grushkowitz, Hayward, CA (US); Kevin Fischer, Orinda, CA (US); Matthew Danning, Oakland, CA (US)

(73) Assignee: SunPower Corporation, San Jose, CA (US)

( * ) Notice: Subject to any disclaimer, the term of this patent is extended or adjusted under 35 U.S.C. 154(b) by 568 days.

This patent is subject to a terminal disclaimer.

(21) Appl. No.: 15/241,648

(22) Filed: Aug. 19, 2016

(65) Prior Publication Data
US 2016/0373053 A1  Dec. 22, 2016

Related U.S. Application Data

(63) Continuation of application No. 13/076,078, filed on Mar. 30, 2011, now Pat. No. 9,450,130.
(Continued)

(51) Int. Cl.
*H02S 30/10* (2014.01)
*H02G 3/04* (2006.01)
(Continued)

(52) U.S. Cl.
CPC ............... *H02S 30/10* (2014.12); *F16L 3/23* (2013.01); *F16L 3/24* (2013.01); *H01L 31/05* (2013.01);
(Continued)

(58) Field of Classification Search
CPC ................................ H02S 30/10; H02S 40/36
See application file for complete search history.

(56) References Cited

U.S. PATENT DOCUMENTS 1,299,799 A   4/1919  Smalley
4,789,250 A  12/1988  Schlueter
(Continued)

FOREIGN PATENT DOCUMENTS

AU  2010-100-671      9/2010
CA  2 761 088 A1    11/2010
(Continued)

OTHER PUBLICATIONS

Office Action dated Nov. 22, 2017 in Korean Patent Application No. 10-2013-7022124, 3 pages.
(Continued)

*Primary Examiner* — Sadie White
(74) *Attorney, Agent, or Firm* — Oblon, McClelland, Maier & Neustadt, L.L.P.

(57) ABSTRACT

A wire management device is disclosed. The device comprises a clip comprising an upper planar member and a lower planar member, each planar member having an inner and outer surface, wherein the inner surface of the upper planar member includes a post extending toward the inner surface of the lower planar member, a stem extending from the outer surface of the lower planar member, the stem including two outwardly-extending flanges, each of the first and second outwardly-extending flanges including an edge portion extending toward the outer surface of the lower planar member, and a transverse passage extending along the outer surface of the lower planar member, the transverse passage extending across the stem, wherein the stem has a recessed portion along the transverse passage.

19 Claims, 4 Drawing Sheets

Related U.S. Application Data

(60) Provisional application No. 61/437,509, filed on Jan. 28, 2011, provisional application No. 61/436,915, filed on Jan. 27, 2011.

(51) Int. Cl.
| | | |
|---|---|---|
| *H02S 40/36* | (2014.01) | |
| *F16L 3/24* | (2006.01) | |
| *H02G 3/32* | (2006.01) | |
| *F16L 3/23* | (2006.01) | |
| *H01L 31/05* | (2014.01) | |
| *F24S 25/20* | (2018.01) | |

(52) U.S. Cl.
CPC ............ *H02G 3/0406* (2013.01); *H02G 3/32* (2013.01); *H02S 40/36* (2014.12); *F24S 25/20* (2018.05); *Y02E 10/50* (2013.01)

(56) References Cited

U.S. PATENT DOCUMENTS

| | | | |
|---|---|---|---|
| 5,189,766 A | 3/1993 | Weber | |
| 6,384,314 B1* | 5/2002 | Lund-Hansen | E06B 9/386 126/621 |
| 2005/0211463 A1 | 9/2005 | Zeuner et al. | |
| 2007/0274618 A1 | 11/2007 | Sandin | |
| 2010/0276558 A1* | 11/2010 | Faust | F24S 25/61 248/222.14 |
| 2014/0053891 A1 | 2/2014 | West | |
| 2014/0305736 A1 | 10/2014 | Gates | |
| 2014/0353435 A1 | 12/2014 | Liu | |
| 2015/0034362 A1 | 2/2015 | Kovalov | |

FOREIGN PATENT DOCUMENTS

| | | |
|---|---|---|
| JP | 2001-056070 | 2/2001 |
| JP | 2001-135848 | 5/2001 |
| JP | 2002-211335 | 7/2002 |
| JP | 2002-303455 A | 10/2002 |
| WO | WO 2008/058411 A2 | 5/2008 |
| WO | WO 2008/124642 A2 | 10/2008 |
| WO | WO 2014-134580 | 9/2014 |

OTHER PUBLICATIONS

Korean Office Action dated Dec. 20, 2017 in Patent Application No. 10-2013-7021315, 9 pages.

Office Action dated Feb. 23, 2018 in Chinese Patent Application No. 201510933673.7.

"HEYClip SunRunner 2 and 2-R Cable Clips, for Mini-Inverter Cables," Heyco website, http://www.heyco.com/alternative_energy_products/pdf/1-11.pdf; retrieved on Dec. 14, 2012.

HEYClip Sun Runner Cable Clip, Double Compression Design, Heyco website; http//heyco.com/alternative_energy_products/pdf/1-10.pdf; retrieved on Dec. 14, 2012.

International Search Report and Written Opinion received in International Patent Application No. PCT/US2011/060629, dated Jan. 23, 2013, filed on Nov. 14, 2011.

"New Cable Clips ACC-R2 and ACC-R4," Wiley Electronics website, http://www.we-llc.com/pdf/tearsheetnewaccts.pdf; retrieved on Dec. 14, 2012.

Office Action dated Feb. 6, 2017 in European Patent Application No. 11 788 292.8.

Office Action dated May 29, 2017 in European Patent Application No. 11 788 292.8.

* cited by examiner

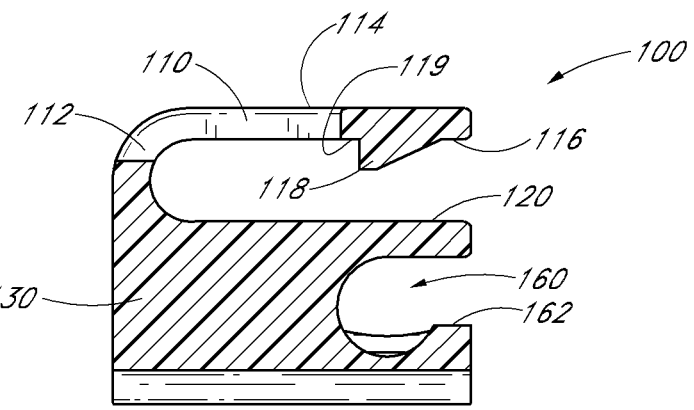
FIG. 4
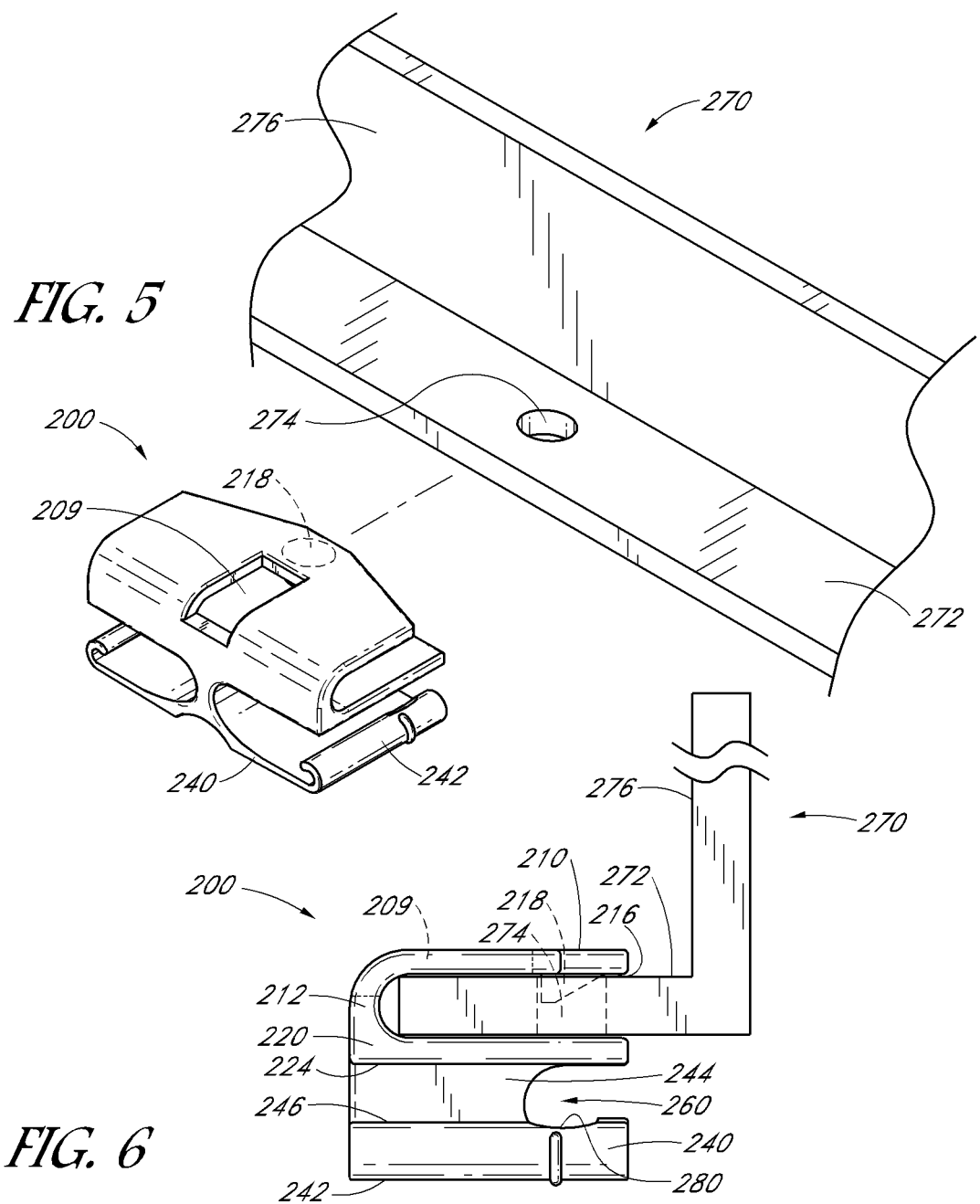
FIG. 5
FIG. 6

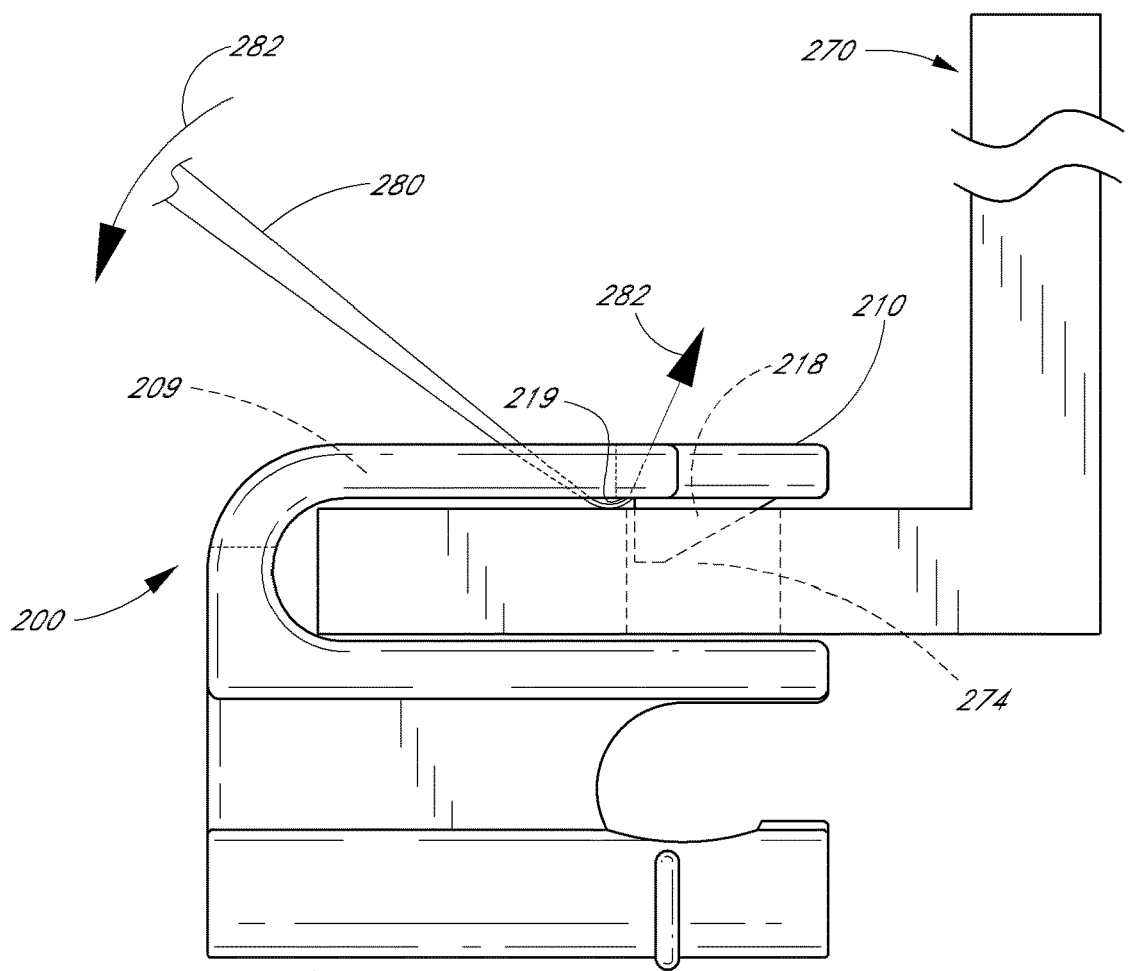
FIG. 7
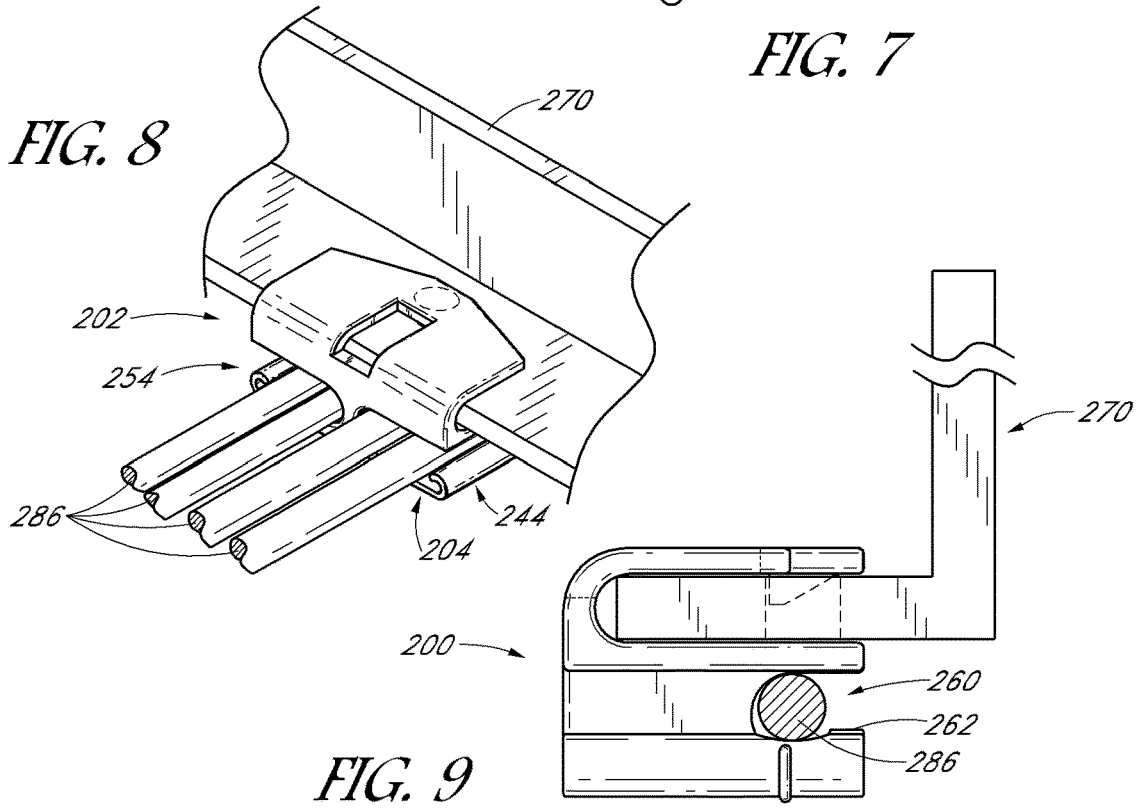
FIG. 8
FIG. 9

US 10,536,110 B2

FRAME-MOUNTED WIRE MANAGEMENT DEVICE

This application is a continuation of U.S. patent application Ser. No. 13/076,078, filed Mar. 30, 2011, which claims the benefit of U.S. provisional patent application Ser. No. 61/436,915, filed Jan. 27, 2011, and U.S. provisional application Ser. No. 61/437,509, filed Jan. 28, 2011.

STATEMENT REGARDING FEDERALLY SPONSORED RESEARCH OR DEVELOPMENT

This invention was made with U.S. Government support under Contract No. DE-FC26-07GO17043 awarded by the Department of Energy. The Government has certain rights in this invention.

TECHNICAL FIELD

Embodiments of the subject matter described herein relate generally to photovoltaic systems using cable connectors. More particularly, embodiments of the subject matter relate to devices and techniques for long-term securing of cables.

BACKGROUND

Distributed energy generation installations can have substantial wiring needs. For example, in the solar context, each of the solar panels in an installation can connect to a neighboring one, until the entire chain is connected to a combining device, and inverter. With many rows of solar panels, the number of connected wires, whether thin-walled or cabled wiring, can cause a significant fraction of the cost of system installation to be devoted to wiring. Additionally, the wiring requires proper positioning. Loose, dangling, or slack wiring can potentially result in hazards.

For this reason, wires are frequently managed using tie devices that constrain the wires, such as by holding them against structural members of the installation. Such tie devices are typically made from nylon or similar materials, installed by hand. A nylon tie device can be wrapped around a wire and structural member to constrain the movement of the wire. Nylon devices, however, brittle and break over time when exposed to outdoor ambient environments. Although they can be inexpensive on a per-unit basis, the cost for manual replacement for failed tie devices can be prohibitively expensive.

Additionally, such tie devices can form only a single loop while closing, forcing all wire-structure interactions into a single constraining relationship, which may not be appropriate for all junctions between wire and structural member. For example, where a wire passes a structural member at a right angle, the nylon tie device wrapped around both can impart a curvature to the wire in bending it to be closer to collinear with the structural member. The curvature can adversely affect the wire's lifetime performance.

BRIEF SUMMARY

A wire management device is disclosed. The device comprises a clip comprising an upper planar member and a lower planar member, each planar member having an inner and outer surface, wherein the inner surface of the upper planar member includes a post extending toward the inner surface of the lower planar member, a stem extending from the outer surface of the lower planar member, the stem including two outwardly-extending flanges, each of the first and second outwardly-extending flanges including an edge portion extending toward the outer surface of the lower planar member, and a transverse passage extending along the outer surface of the lower planar member, the transverse passage extending across the stem, wherein the stem has a recessed portion along the transverse passage.

A photovoltaic system is also disclosed. The photovoltaic system comprises a photovoltaic solar panel comprising a frame having a flange, the flange having a surface retention feature offset from an edge of the flange, and a wire management device comprising a clip having an engagement feature, the clip adapted to contact the flange and form an interference fit, the clip further adapted to releaseably couple to the flange by engaging the engagement feature to the retention feature, the wire management device additionally comprising a first wire retention portion having an enclosure for retaining a wire, the wire retention portion positioned to receive a wire extending in a direction transverse to the edge of the flange.

A wire management device for a photovoltaic system is also disclosed. The wire management device comprises a clip means for engaging a frame of a photovoltaic solar panel, a first wire holding means for receiving and retaining at least one wire in a first direction, and a second wire holding means for receiving and retaining at least one wire in a second direction, the first direction transverse to the second direction.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 4 is a cross-sectional view of the embodiment of the wire management device of FIG. 3 taken along the line 4-4;

FIG. 5 is a perspective view of an embodiment of a wire management device adjacent a portion of a frame member;

FIG. 6 is a side view of the engaged wire management device and portion of a frame member of the embodiment of FIG. 5;

FIG. 7 is a side view of the engaged wire management device and portion of a frame member of the embodiment of FIG. 5 in a releasing state;

FIG. 8 is a perspective view of an embodiment of a wire management device engaged with a portion of a frame member with a plurality of retained wires in a first direction;

FIG. 9 is a side view of an embodiment of a wire management device engaged with a portion of a frame member with a retained wires in a second direction;

DETAILED DESCRIPTION

Figure 1:
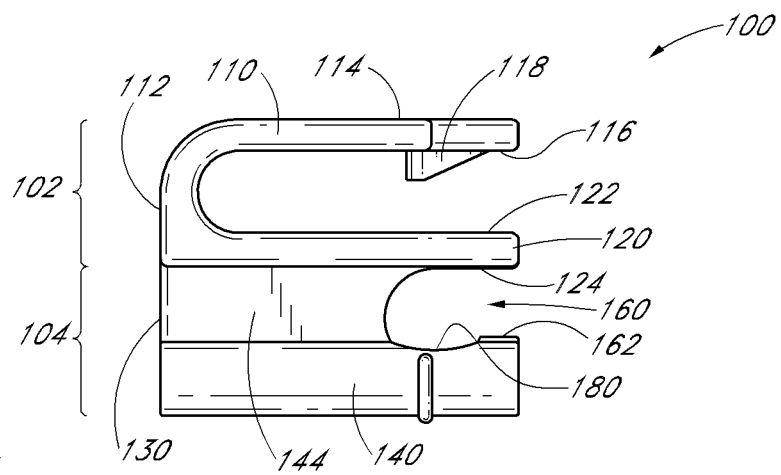
FIG. 1 is a side view of an embodiment of a wire management device.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the schematic shown in FIG. 6 depicts one exemplary arrangement of elements, additional intervening elements, devices, features, or components may be present in an embodiment of the depicted subject matter.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

One advantageous improvement on the widely-used nylon tie devices is a NORYL™ wire retention device designed to interact with a structural member of a distributed energy generation installation. Such a device can have one or more features corresponding to features of the structural member to assist easy placement and engagement. Wire retention features can exist in multiple directions, permitting a single clip to function in diverse wire/structure arrangements throughout the installation. The single device can be mass produced for a relatively low cost which, when compared against the labor and material cost for initial and replacement nylon tie device usage during the lifetime of the single device, can be a significant financial advantage over the operational life of the installation.

Although discussed in the context of a photovoltaic solar installation having many solar panels, each panel with a frame, the wire management device and certain techniques described herein may be equally applicable to, but by no means limited to, other types of distributed energy generation facilities, such as wind or solar thermal installations. Any installation may benefit from the advances described herein, so long as wire management is a need to be addressed. Thus, data centers, communication racks, and similar wire-carrying installations can also employ the devices and techniques below.

FIGS. 1-4 illustrate a wire management device 100 having two major, integrally-formed portions. The upper portion 102 comprises a clip for coupling to a frame of a structural member. The lower portion 104 comprises several wire retention features. Both are described in greater detail below.

The upper portion 102 can include a clip having an upper planar member 110 and a lower planar member 120. The lower portion 104 can include a stem 130, first and second outwardly-extending flanges 140, 150, and a transverse passage 160. The upper portion 102 can be used to releasably couple to a frame of a structural member, such as one having an edge flange. The lower portion 104 can receive and retain wires, inhibiting shifting or free-hanging by the wires.

The upper portion 102 can have upper and lower planar members 110, 120. The planar members 110, 120 can be coupled by a rear joining portion 112. The rear joining portion 112 can serve as a stop, preventing the wire management device 100 from sliding too far onto a flange which is positioned between the planar members 110, 120. The upper planar member 110 can have an upper surface 114 and a lower surface 116. The lower surface 116 can include a protruding feature, such as the post 118. Although shown relatively flat and straight, the upper and lower surfaces 114, 116 of the upper planar member 110 can have contours or an angled shape, if desired for the embodiment.

The post 118 is but one embodiment of what can be any type of interference-fit and engagement feature, as is illustrated and described in greater detail below. The post 118 can have a circular cross-section and extend downward from the lower surface 116 of the upper planar member 110. The post 118 can have a sloped surface on the top, including one which tapers toward the front of the wire management device 100, as shown. The post 118 can be integrally formed with the rest of the upper portion 102. Catch 119 is a portion of the lower surface 116 of the upper planar member 110 which is between the notch 109 and the post 118.

The upper planar member 110 can also have a slot or notch 109. The notch 109 can be formed by omitted material from the upper portion 102. In certain embodiments, the notch 109 can be aligned with the post 118, as shown. The notch 109 can extend back into the rear joining portion 112, extending down to the upper surface 122 of the lower planar member 120. In some embodiments, the notch 109 can extend only through the upper planar member 110.

The lower portion 104 can be formed integrally with the upper portion 102 as a single unit, such as by injection molding the entire wire management device 100. In certain embodiments, the lower portion 104 can be separate unit and coupled to the upper portion 102 such as with a fastener or adhesive or bonding technique. In some embodiments, the upper and lower planar members 110, 120 can be reoriented by bending the rear joining portion 112. Thus, the upper and lower planar members 110, 120 can be pried apart and, in some embodiments, elastically return to their undeformed position.

The lower portion 104 can include an upper surface 122 and a lower surface 124. The upper surface 122 can face the lower surface 116 of the upper portion 102. The lower portion 104 can, in some embodiments, cooperate with the upper portion 102 to form a tapering cavity which draws shorter toward the rear joining portion 112.

Figure 2:
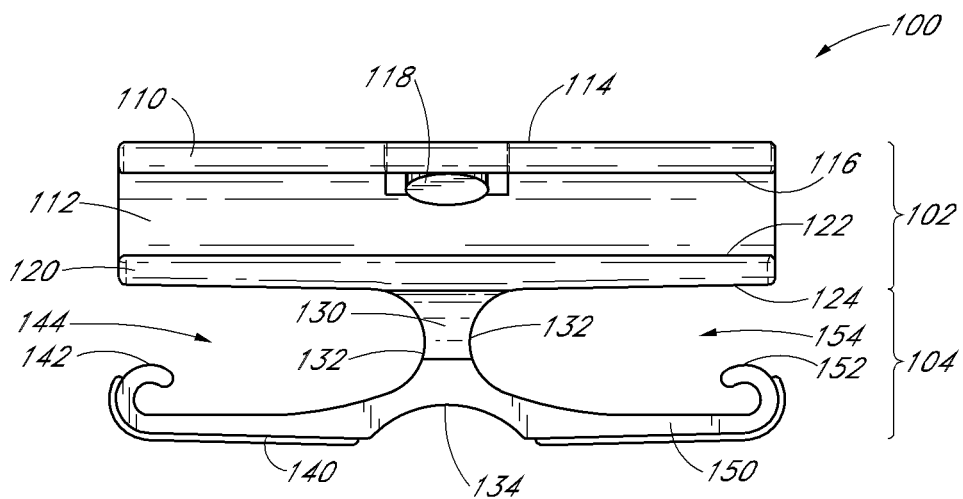
FIG. 2 is front view of the embodiment of the wire management device of FIG. 1.

The upper surface 122 can be smooth and flat, or angled or have surface features, as desired for the embodiment. The lower surface 124 can smoothly transition to the stem 130. The stem 130 can extend downward from the lower surface 124 to any length desired for wire retention. In certain embodiments, the stem 130 can have a length of between two millimeters to two centimeters, or any other length desired for the embodiment. The stem 130 can have lateral curved surfaces 132, as seen in FIG. 2. The stem 130 can also have a curved front portion forming the transverse passage 160. In certain embodiments, the stem 130 can curl upwards at its extreme end, forming a transverse engagement feature 162.

The stem 130 can additionally have two outwardly-extending flanges 140, 150. Each flange 140, 150 can extend a sufficient length to retain one or two or more wires of approximately a circle cross-section. For example, the first outwardly-extending flange 140 can extend in a direction approximately parallel to the upper and lower planar members 110, 120. In certain embodiments, the stem 130 can have a weight-reducing cutout 134 below and between the flanges 140, 150.

The flanges 140 can be level or, as shown in the illustrated embodiment, have a curled or curved shape sloping out from the stem 130. The flanges 140, 150 can have smooth or ridged surfaces, as desired for the embodiment, to assist with retaining wires. The flanges 142, 152 can each have a respective upwardly-extending edge 142, 152 which rises toward the lower surface 124 of the lower planar member 120. The edges 142, 152 can extend partway upwards, marking a side enclosure 144, 154 on either side of the stem 130 and below the lower surface 124 of the lower planar member 120. The edges 142, 152 are illustrated as curled ends of the flanges 140, 150, but in other embodiments, the edges 142, 152 can extend upwards at a sharper angle, such as a right angle, if desired for the embodiment.

In some embodiments, the wire management device 100 can have a groove or recess 180 in the edges 142, 152 as shown in FIG. 1. The recess 180 can increase the diameter of a wire which can be accommodated by the wire management device 100 when the wire is positioned in the transverse passage 160. Additionally, by lowering the height of the edges 142, 152 relative to the transverse passage 160, not only can a larger wire diameter be received, but it can also pass through the wire clip with less bending, reducing the stress imposed on the wire. FIG. 9, described in greater detail below, illustrates how such a wire 286 can pass through the transverse passage 160.

In some embodiments, the edges 142, 152 are single, solid, rigid members. In other embodiments, the edges 142, 152 can be biasing members adapted to enclose the side enclosure 144, 154 and thereby retain wires inserted thereto. Thus, an edge 142, 152 can be spring clip, or locking device manipulable by an operator of the wire management device 100. In certain embodiments, the edges 142, 152 can be an elastomeric portion which bends to admit a wire, but will retain the wire within the enclosure 144, 154 until similar force is imparted to bend the edge 142, 152 and free the wire. Different edges can have differing embodiments of these or other similar features.

Figure 3:
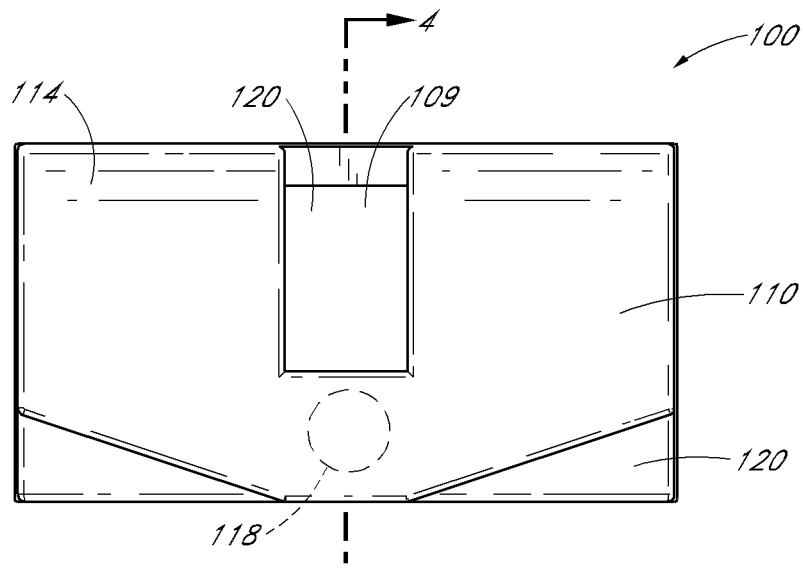
FIG. 3 is a top view of the embodiment of the wire management device of FIG. 1.

With continued reference to FIGS. 1-4, a top view of the wire management device 100 is illustrated in FIG. 3. The notch 109 is visible behind and in line with the post 118. As shown, the upper planar member 110 can have recessed corners revealing the lower planar member 120 below. A cross-sectional view of the wire management device 100 is shown along line 4-4 in FIG. 4.

As can be seen in FIG. 4, the rear joining portion 112 can be omitted in the region of the notch 109. Similarly, the stem 130 can be a solid portion forming the transverse passage 160 and the transverse engagement feature 162. Additionally, the slanted shape of the post 118 can be seen.

The wire management device 100 can engage a flange or portion of a frame with the upper portion 102 and retain wires with the lower portion 104. In some embodiments, the wires can be positioned in the side enclosures 144, 154. As an alternative usage of the same embodiments, one or more wires can be positioned in the transverse passage 160, permitting wires at substantially a right angle to be constrained by the same device, reducing the need for different devices in the same installation.

In some embodiments, a single wire can be held by each side enclosure 144, 154, while in other embodiments, multiple embodiments can be retained by each side enclosure 144, 154. The wires, once positioned in a side enclosure, are inhibited from then leaving the enclosure absent purposeful intervention by an operator by the edges 142, 152. Similarly, the transverse engagement feature 162 can inhibit a transversely-retained wire from leaving the transverse passage 160.

The wire management device 100 can be composed of a polystyrene and/or polyphenylene oxide, including blends of such materials, such as NORYL™ or another wear and weather resistant plastic. The wire management device 100 can also be composed of glass-filled plastics, such as glass-filled NORYL™, as well as or other polymers, co-polymers, including thermoplastics like acetal. Any such material with sufficient UV-resistance over the lifetime of a distributed energy generation system to maintain sufficiently its operating characteristics and material properties can be used.

FIGS. 5-9 illustrated certain embodiments of a wire management device 200 adjacent a portion 270 of a frame of a photovoltaic solar cell module. Other systems unrelated to photovoltaics or energy generation, such as computer mounting frames, and so on, can also interoperate with the wire management device 200, if desired, provided they have similar functionality. Unless otherwise specified, numerical indicators used in FIGS. 5-8 are similar to those used above with respect to FIGS. 1-4, except that the number has been incremented by 100.

The portion 270 includes a side frame member 272 having a hole 274. In certain embodiments of the wire management device 200, the distance between the upper and lower planar members 210, 220 can be about the same as the thickness of the side frame member 272. Additionally, the post 218 can be of approximately the same size or slightly smaller than the size of the hole 274. The post 218 can be tapered so as to be easy to engage with the side frame member 272. The rear joining portion 212 can exert a force directing the post 218 against the top of the side frame member 272. As the wire management device 200 is moved onto the portion 270, the post 218 can, when properly positioned, clip downward into the hole 274. In this way, the wire management device 200 can be releasably coupled to the portion 270.

FIG. 6 shows a side view of an embodiment of a wire management device 200 in such an engaged position. The post 218 extends downward into the hole 274, securing the device 200 from disengaging or decoupling from the portion 270. In certain embodiments, the upper and lower planar members 210, 220 can form an interference fit with the side frame member 272 alone, without the engagement of the post 218 and hole 274. In such embodiments, the wire management device 200 can thereby be coupled to the portion 270, illustrating one of several ways to engage the upper portion 202 to the portion 270.

Catch 219 is a portion of the lower surface 216 of the upper planar member 210 which is between the notch 209 and the post 218. As shown in FIG. 7, a tool 280 can be inserted into the notch 209 and positioned against catch 219. The tool 280 can be a planar member, such as the head of a flathead screwdriver, a chisel, or any other lever-like object which can engage the catch 219. When the tool 280 is rotated in the manner illustrated by the arrow 282, the tool 280 will impart a lever force against the upper planar member 210, at catch 219, lifting the post 218 out from the hole 274. In such a manner, the wire management device 200 can be released from the portion 270, thereby decoupling it for later re-attachment. In certain embodiments, the force required to decouple the wire management device 200 from the portion 270 can be small enough that manual manipulation can achieve the same decoupling.

Additionally, the upper planar member 210 can have a tapered design where the corners are cropped, as shown. Because the corners are missing, the wire management device 200 can be rotated without the upper planar member 210 contacting the vertical wall 276 of portion 270. Additionally, the upper planar member 210 can be spaced apart from the vertical wall 276 with the post 218 is disposed in the hole 274. Because of the taper of the post 218, the wire management device 270 can be decoupled from the portion 270 by imparting a force on the rear joining portion 212 towards the vertical wall 276. The wire management device 200 will travel towards the vertical wall 276, along the sloped and tapered surface of the post 218, guiding the post 218 upwards and out of the hole 274. In this way, the wire management device 200 can be released from the portion 270 without the use of the tool 280.

FIG. 8 illustrates the wire management device 200 in a coupled position wherein wires 286 are restrained by the lower portion 204. As can be seen, the upper portion 202 simultaneously couples the wire management device 200 to the frame portion 270. In such a position, the wires 286 can be engaged in the side enclosures 244, 254, inhibiting their movement during incidental forces. FIG. 9 illustrates an arrangement similar to that of FIG. 8, except that the wire 286 is positioned in the transverse passage 260, passing above or through the recess 280. The wire management device 200 is coupled to the frame portion 270 in a manner similar to that described above. The wire 286 can be inhibited from freely moving by the transverse engagement feature 262.

In addition the illustrated orientations, the wire management device 200 can be oriented such that the lower portion 204 is above the surface of the frame side member 272. In such an position, the post 218 can still engage the hole 274, thereby securing the wire management device 200 to the portion 270. Wires can then be positioned in either the side enclosures 244, 254 or the transverse passage 260. As with other orientations, wires can be disposed in each position for movement restriction simultaneously if they are of sufficiently small size so as to not interfere with each other. In this way, the single clip can accommodate wire management for many wires with a single device, including those at different orientations to the portion 270.

Figure 10:
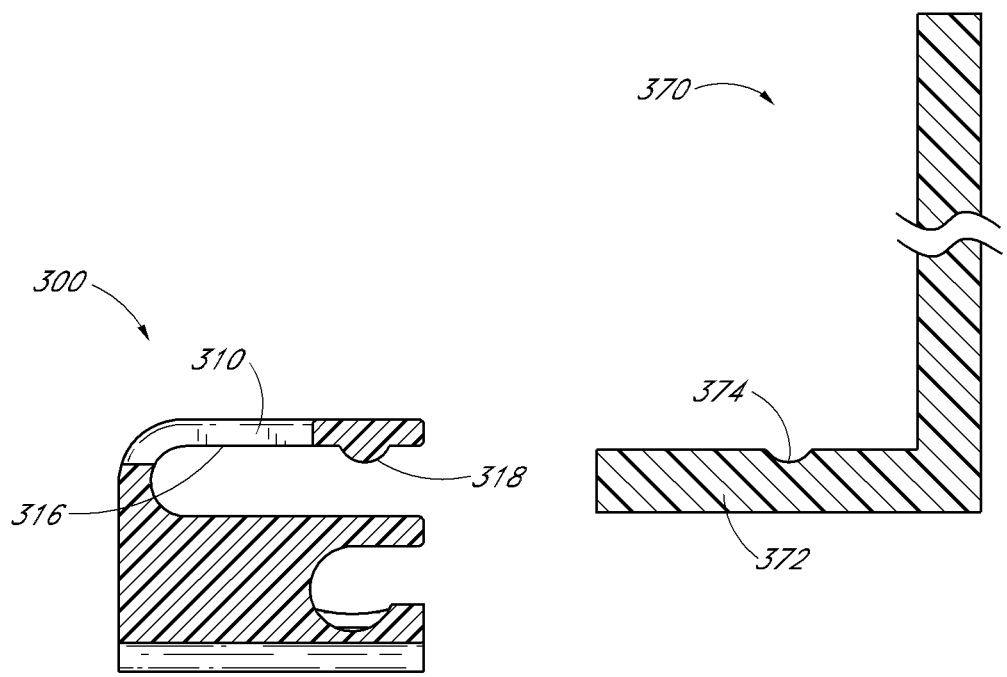
FIG. 10 is another embodiment of a wire management device adjacent a portion of a frame member.

FIG. 10 illustrates an embodiment similar to those described above. Unless otherwise specified, the features are similar to those described above and the numerical indicators in FIG. 10 indicate similar elements as those referenced above with respect to FIGS. 5-9, except that the number has been incremented by 100. The wire management device 300 can have different engagement features, of which the post 218 above is just one. FIG. 10 illustrates a different engagement feature wherein the clip engagement feature 318 is a downward protrusion, whether circular or an elongated groove descending from the lower surface 316 of the upper planar member 310. The clip engagement feature 318 is preferably sized and shaped to fit in a groove 374 of the portion 370. The groove 374 can be a circular depression or elongated channel to receive the appropriate embodiment of the clip engagement feature 318. The engagement between the clip engagement feature 318 and groove 374 can occur similarly to the post 218 and hole 274 described above, including coupling the wire management device 300 against the portion 370 in a similar manner. Such clip means can vary between this and other embodiments, including the embodiment illustrated in FIG. 11 without deviating from aspects of the invention.

Figure 11:
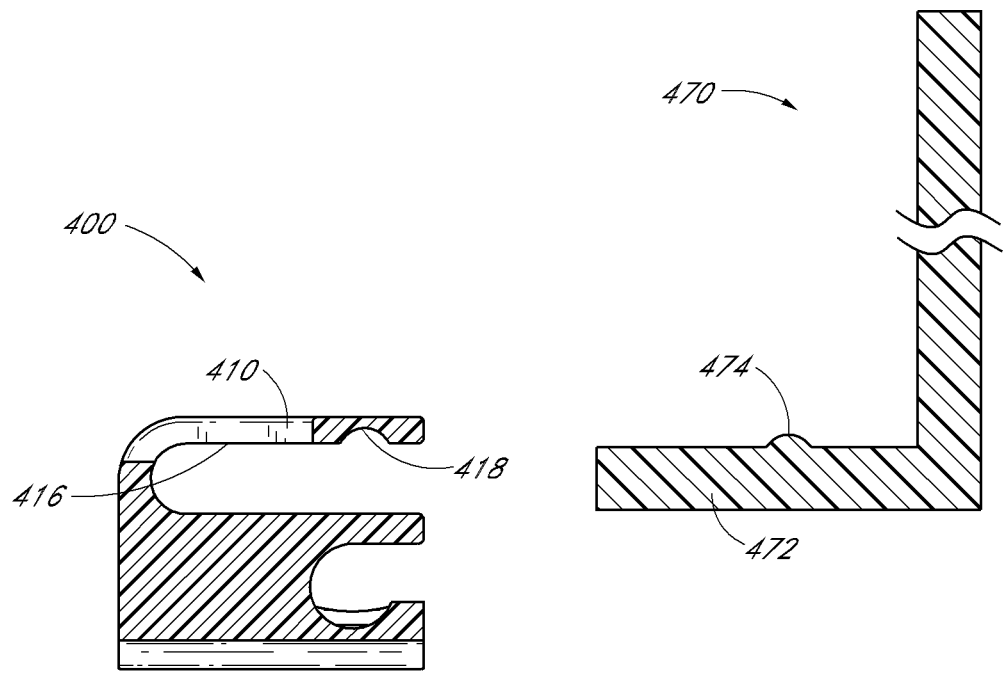
FIG. 11 is yet another embodiment of a wire management device adjacent a portion of a frame member.

FIG. 11 illustrates another embodiment of a clip engagement feature 418 wherein the clip engagement feature 418 comprises a recess in the lower surface 416 of the upper planar member 410. Unless otherwise specified, the numerical indicators in FIG. 11 refer to similar components as those above with respect to FIG. 10, except that the number has been incremented by 100. The frame side member 472 includes a protrusion 474 which is appropriately sized and shaped to engage the clip engagement feature 418 of the wire management device 400. The clip engagement feature 418 can be sized and shaped appropriately to receive the protrusion 474, thereby coupling the wire management device 400 to the portion 470 in a manner similar to those described above in FIGS. 5-10.

The wire management device described herein can be releasably coupled to a frame or other structural member which has a surface engagement feature. The wire management device can include one or more enclosures, passages, or retention features for securing wires. The wire management device can be composed of NORYL™ or other high-performance plastic material to resist wear and weather during the operation lifetime of a distributed energy installation where it is present.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The invention claimed is:

1. A wire management device comprising:
an upper planar member;
a lower planar member spaced apart from the upper planar member, the upper planar member and the lower planar member each having an upper surface facing a first direction and a lower surface facing a second direction, wherein the lower surface of the upper planar member faces the upper surface of the lower planar member;

a rear joining portion joining a rear end of the upper planar member to a rear end of the lower planar member;

a recess formed by the lower surface of the upper planar member, the upper surface of the lower planar member, and the rear-joining portion, the recess sized and shaped to receive a frame member of a photovoltaic module from a front side of the wire management device;

a stem extending from the lower surface of the lower planar member, the stem including a recessed portion facing the front side of the wire management device;

first and second outwardly-extending flanges that each include a planar body that extends in a direction parallel to the upper planar member and the lower planar member, the first and second outwardly-extending flanges extend outwardly from the stem to edge portions of the first and second outwardly-extending flanges, each of the first and second outwardly-extending flanges having a groove in an upper surface thereof, the upper surfaces of the first and second outwardly-extending flanges facing the lower surface of the lower planar member; and a first passage formed by the grooves in the first and second outwardly-extending flanges, the recessed portion in the stem, and the lower surface of the lower planar member, the first passage being configured to receive and support a first wire entering the first passage over the edge portion of the first outwardly-extending flange, extending across the recessed portion in the stem, and exiting the first passage over the edge portion of the second outwardly-extending flange, such that the first wire when partially enclosed in the first passage extends all the way through the wire management device.

2. The wire management device of claim 1, wherein the edge portion of each of the first and second outwardly-extending flanges includes a curled end curling upward from an upper surface of the planar body of the first and second outwardly-extending flanges toward the lower surface of the lower planar member and curling inward toward the stem.

3. The wire management device of claim 2, wherein the groove in the upper surface of each of the first and second outwardly-extending flanges is provided in a portion of the curled end that is closest to the lower surface of the lower planar member.

4. The wire management device of claim 1, wherein the edge portion of each of the first and second outwardly-extending flanges includes an angled end angled upward toward the lower surface of the lower planar member and angled inward toward the stem.

5. The wire management device of claim 4, wherein the groove in the upper surface of each of the first and second outwardly-extending flanges is provided in a portion of the angled end that is closest to the lower surface of the lower planar member.

6. The wire management device of claim 1, further comprising:

a second passage extending between the lower planar member and the first outwardly-extending flange, the second passage configured to receive and support a second wire extending along the edge portion of the first outwardly-extending flange such that the second wire when partially enclosed in the second passage extends all the way through the wire management device; and a third passage extending between the lower planar member and the second outwardly-extending flange, the third passage configured to receive and support a third wire extending along the edge portion of the second outwardly-extending flange such that the third wire when partially enclosed in the third passage extends all the way through the wire management device.

7. The wire management device of claim 6, wherein the first passage and the second passage intersect with the third passage to form a single U-shaped cavity within the wire management device.

8. The wire management device of claim 1, wherein the recessed portion has a curved surface forming a portion of a circular shape.

9. The wire management device of claim 1, wherein the wire management device is a single, integrally-formed piece.

10. The wire management device of claim 1, further comprising a post disposed between the front end and the rear end of the upper planar member and spaced apart from the rear joining portion, wherein the post is sized and shaped to engage a hole in a portion of the frame member.

11. The wire management device of claim 1, further comprising a channel in one of the lower surface of the upper planar member and the upper surface of the lower planar member, the channel sized and shaped to engage a raised portion of the frame member.

12. The wire management device of claim 1, wherein the wire management device is composed of a polymer.

13. A photovoltaic system comprising:

a photovoltaic solar panel comprising a frame having a planar flange extending along a first plane, the flange having a surface retention feature offset from an edge of the flange;

a wire management device comprising:

an upper planar member, a lower planar member spaced apart from the upper planar member, and a rear joining portion, the upper planar member and the lower planar member each having an upper surface facing a first direction, a lower surface facing a second direction, a fixed rear end, and a free front end;

wherein the lower surface of the upper planar member faces the upper surface of the lower planar member;

wherein the rear joining portion connects the fixed rear end of the upper planar member to the fixed rear end of the lower planar member, wherein the lower surface of the upper planar member, the upper surface of the lower planar member, and the rear-joining portion form a recess sized and shaped to receive a portion of the planar flange of the photovoltaic solar panel from a front side of the wire management device;

a post disposed between the front end and the rear end of the upper planar member and spaced apart from the rear joining portion, wherein the post is sized and shaped to engage the surface retention feature of the photovoltaic solar panel, and a stem extending from the lower surface of the lower planar member, the stem comprising a recessed portion facing the front side of the wire management device;

first and second outwardly-extending flanges that each include a planar body that extends in a direction parallel to the upper planar member and the lower planar member, the first and second outwardly-extending flanges extend outwardly from the stem to respective edge portions, upper surfaces of the first and second outwardly-extending flanges facing the lower surface of the lower planar member;

a first passage formed by the upper surfaces of the first and second outwardly-extending flanges, the recessed portion in the stem, and the lower surface of the lower planar member, wherein the first passage is configured to receive and support a first wire, and the first passage is formed such that the first wire enters the first passage over the edge portion of the first outwardly-extending flange, extends across the recessed portion in the stem, and exits the first passage over the edge portion of the second outwardly-extending flange, whereby the first wire when partially enclosed in the first passage extends all the way through the wire management device;

a second passage extending between the lower planar member and the first outwardly-extending flange, the second passage configured to receive and support a second wire extending along the edge portion of the first outwardly-extending flange such that the second wire when partially enclosed in the second passage extends all the way through the wire management device; and a third passage extending between the lower planar member and the second outwardly-extending flange, the third passage configured to receive and support a third wire extending along the edge portion of the second outwardly-extending flange such that the third wire when partially enclosed in the third passage extends all the way through the wire management device.

14. The photovoltaic system of claim 13, wherein each of the first and second outwardly-extending flanges comprise a groove in the upper surface at a location of the first passage.

15. The photovoltaic system of claim 13, wherein the first passage and the second passage intersect with the third passage to form a single U-shaped cavity within the wire management device.

16. The photovoltaic system of claim 13, wherein the wire management device is constructed from a polymer.

17. The wire management device of claim 1, wherein the upper planar member includes an opening extending through the upper planar member.

18. The wire management device of claim 17, wherein the opening extends into the rear joining portion.

19. The photovoltaic system of claim 13, wherein the edge portion of each of the first and second outwardly-extending flanges includes a curled end curling upward from an upper surface of the planar body of the first and second outwardly-extending flanges toward the lower surface of the lower planar member and curling inward toward the stem.

* * * * *